(12) United States Patent
Charlon

(10) Patent No.: US 6,914,489 B2
(45) Date of Patent: Jul. 5, 2005

(54) VOLTAGE-CONTROLLED OSCILLATOR PRESETTING CIRCUIT

(75) Inventor: Olivier Charlon, Sunnyvale, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/259,012

(22) Filed: Sep. 26, 2002

(65) Prior Publication Data
US 2004/0061559 A1 Apr. 1, 2004

(51) Int. Cl.[7] .................................................. H03L 7/00
(52) U.S. Cl. ......................... 331/16; 331/17; 331/1 A; 331/34; 331/175; 327/156; 375/376
(58) Field of Search .......................... 331/1 A, 25, 17, 331/16, 34, 175; 375/376; 455/260; 327/156

(56) References Cited

U.S. PATENT DOCUMENTS 5,563,552 A * 10/1996 Gersbach et al. ............ 331/1 A
6,552,618 B2 * 4/2003 Nelson et al. ................. 331/11
6,735,181 B1 * 5/2004 Babitch ....................... 370/290

FOREIGN PATENT DOCUMENTS

EP 0402113 B1 12/1990

* cited by examiner

Primary Examiner—Arnold Kinkead
(74) Attorney, Agent, or Firm—Aaron Waxler

(57) ABSTRACT

A circuit comprises a frequency synthesizing circuit with a voltage-controlled oscillator whose frequency is preset to a preset value. The voltage-controlled oscillator generates an oscillating signal in response to an input voltage. The frequency synthesizing circuit is configured to operate in a locked loop mode under control of an error signal representative of a phase frequency differential between the divided oscillating signal and a reference signal. A digital processing unit can disable the frequency synthesizing circuit to operate in phase locked loop mode. Once the synthesizing circuit is disabled, the digital processing unit determines a first and a second frequency of the oscillating signal in response to respective first and second loop filter input voltage values. The unit further generates a control value from the two frequencies, the frequency divider dividing ratio and the reference signal. The circuit further comprises a digital to analog converter configured to preset the loop filter input voltage to a preset value in response to the control value. Once the voltage controlled oscillator output oscillates at the corresponding input preset value, the digital processing unit disables the digital to analog converter and enables the frequency synthesizing to operate in phase locked loop mode.

11 Claims, 1 Drawing Sheet

VOLTAGE-CONTROLLED OSCILLATOR PRESETTING CIRCUIT

FIELD OF THE INVENTION

The invention relates to a circuit arrangement for presetting a frequency synthesizing circuit comprising a voltage-controlled oscillator. The invention may be relevant to wireless systems that mandate fast frequency locking to efficiently operate.

BACKGROUND

Wireless transmitters and receivers may include one or more voltage controlled oscillators (VCO) of which very little variation of the oscillating frequencies is tolerated. The oscillating frequency of a voltage-controlled oscillator may be conventionally set and dynamically adjusted to a reference frequency value by means of a phase-locked loop (PLL). The phase-locked loop operates under control of an error signal representative of the phase and frequency differential between the reference signal oscillating at the reference frequency and a signal representative of the divided oscillating signal of the voltage controlled oscillator.

It has been long desirable in the art to enable a PLL to lock to the reference frequency in the least possible amount of time. A possible way of reducing the locking time of a frequency synthesizer is to charge the loop filter with a higher charge pump current than in its normal mode of operation. This current may be controlled by external circuitry. The locking time depends on the charge pump and on how much current the charge pump can deliver to the capacitors of the loop filter of the PLL and thus increasing this current to a certain extent accelerates the initial charging of the capacitors of the loop filter.

Another possible method for adjusting the voltage controlled oscillator frequency is described in European Patent Specification No 0402113B1. EP 0402113B1 gives a circuit for setting the free-running frequency of a voltage-controlled oscillator in a phase locked loop (PLL). The circuit comprises a digital to analog converter (DAC) in the PLL with the output of the DAC being connected to the input of the VCO. The output of the DAC represents substantially the center of a pre-selected PLL lock range. A frequency locked loop (FLL) initially sets the free-running frequency of the VCO to a pre-selected value. The FLL is also used to dynamically adjust the free-running frequency to maintain it within the pre-selected lock range of the PLL in the event of drift due to relatively large changes in supply voltage and/or temperature. The FLL may comprise a digital processing unit and a DAC. Initially the PLL is disabled and while the PLL is disabled, the FLL sets up the free-running frequency. The frequency of the VCO is compared with reference clock pulses from a source and based on the comparison the DAC input controlling the free-running frequency is gradually adjusted by increments or decrements of 1.

SUMMARY OF THE INVENTION

An object of the invention is to further speed up the locking of a phase locked loop.

Another object of the invention is to improve the switching time of a frequency synthesizing circuit.

Yet another object of the invention is to provide a different presetting circuit from that disclosed in the above-mentioned European document and thereby achieving a reduction in the locking time.

To this end, a circuit of the invention comprises:

a frequency synthesizing circuit comprising a voltage controlled circuit for generating an oscillating signal from an input voltage, and the synthesizing circuit being configured to operate in a phase locked loop mode under control of an error signal representative of a phase and frequency differential between the divided oscillating signal and a reference signal;

a digital processing unit configured to disable the frequency synthesizing circuit to operate in the phase locked loop mode and thereafter determine a first and a second frequency of the oscillating signal obtained in response to respective first and second input voltage values and, further configured to generate a digital control signal from the two frequencies, the frequency divider dividing ratio and the reference signal; and, a digital to analog converter configured to preset the input voltage in response to the digital control value.

Such a circuit allows determining a value of the input voltage that causes the divided output of the voltage controlled oscillator to oscillate at a frequency near the reference frequency prior to the frequency synthesizing circuit operating in the phase locked loop mode. The locking time of the frequency synthesizing circuit may thereby be greatly reduced compared to a phase locked loop circuit where the loop gradually locks without prior setting of the oscillating frequency of the VCO. In the invention, the optimized value of the input voltage is derived from interpolation using the characteristic of the VCO determined from at least two measurements of the VCO frequency in response to different input voltages. In a simple embodiment, the frequency response of the VCO is assumed to be linear versus the voltage applied at the input. An advantage of one or more embodiments of the invention is to provide a quick and efficient presetting of the VCO. The digital processing unit generates a digital control signal that corresponds to the determined optimized input voltage. The digital control signal may be a control word retrieved from a look-up table of control word vs. output voltage of the digital-to-analog converter (DAC). Once the voltage at the input of the VCO is set by the DAC via the loop filter, the DAC is disabled and the frequency synthesizing circuit may be set up to operate in the phase-locked loop mode.

The VCO frequency presetting performed by the digital processing unit and DAC may be further fine tuned by improving the sensitivity or resolution of the DAC.

BRIEF DESCRIPTION OF THE DRAWING

The invention is explained in further details, by way of examples, and with reference to the accompanying drawing wherein.

DETAILED DESCRIPTION

Figure 1:
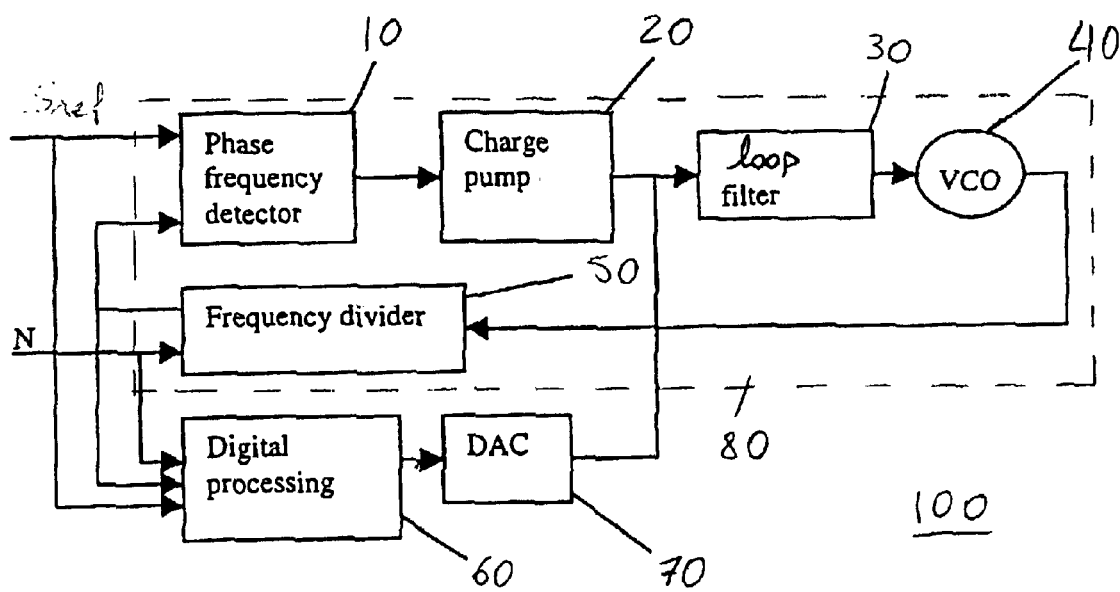
FIG. 1 is a block diagram of a circuit of the invention.

Circuit 100 of FIG. 1 comprises frequency synthesizing circuit 80, which may operate in a locked loop mode or open loop mode. Circuit 80 comprises voltage controlled oscillator (VCO) 40, loop filter 30, charge pump 20, phase frequency detector 10 and frequency divider 50. Phase frequency detector 10 is provided with a reference signal Sref and in the locked loop mode, output of VCO 40 is dynamically adjusted to provide a divided oscillating signal within a locked frequency range of the reference frequency of reference signal Sref. In an embodiment of the invention, VCO 40 is dynamically adjusted in response to a phase and frequency differential signal from phase frequency detector 10 representative of a phase and frequency differential between reference signal Sref and output oscillating signal of VCO 40 passed through frequency divider 50. Frequency divider 50 enables reducing the frequency of VCO output signal 40 by a dividing ratio N. The phase frequency differential signal is further passed through charge pump 20 and thereafter filtered through loop filter 30. Charge pump 20 generates current that permits charging and discharging capacitors of loop filter 30. Loop filter 30 controls input voltage V at the input of VCO 40. In an embodiment of the invention loop filter 30 is implemented as a low-pass filter. VCO 40 provides an oscillating frequency signal oscillating at a given frequency in dependence on an input voltage of VCO 40. The frequency response of VCO 40 as a function of the VCO input voltage or as a function of the filter input voltage may vary with time and external conditions of operations such as temperature, changes in supply voltage or magnetic interferences with other electronic devices or circuits in the vicinity.

Circuit 100 further comprises digital processing unit 60 and digital-to-analog converter (DAC) 70. DAC 70 is connected on its output to the input of filter 30 and sets up the input voltage of filter 30 to a value determined in response to a respective digital word provided at the input of DAC 70. Digital processing unit 60 receives the reference signal Sref, the dividing ratio N and the frequency divider output signal representative of the VCO oscillating signal. In the invention, unit 60 prevents circuit 80 from operating in the locked mode and while circuit 80 is in the open loop mode, unit 60 determines a preset value of the input voltage of filter 30 that causes frequency divider 50 output to oscillate at a frequency near the reference frequency. The input voltage of filter 30 is determined as follows.

In this embodiment, unit 60 has access to a correspondence table giving respective input control words for respective output voltages of DAC 70. While circuit 80 is in the open loop mode, unit 60 causes the input voltage of filter 30 to take two preselected values V1 and V2. For each voltage value V1 or V2, unit 60 determines corresponding frequency measured at the output of frequency divider 50 and the corresponding VCO frequencies F1 and F2 obtained for voltages V1 and V2. In this embodiment, the characteristic of VCO 40 is assumed to be linear. Unit 60 thereafter determines by linear interpolation the set up voltage to be applied at the input of filter 30 to cause VCO 40 divided output by frequency divider 50 to oscillate substantially close to the reference frequency.

The sensitivity of the presetting of the input voltage of filter 30 is dependent on the resolution of DAC 70 and a DAC with a higher resolution may be used to enhance the quality of the presetting may be further improved and as a consequence the locking time may be further reduced. The quality of the presetting may be further enhanced by deriving a more accurate approximation of the characteristic of VCO 40. Indeed, it must be noted that the assumption of the characteristic of the VCO 40 being linear is by no means a limitation of the invention and other shapes of characteristics of VCO 40 are also encompassed in the invention. For example, a more accurate approximation of the VCO characteristic may be obtained by measuring VCO frequencies corresponding to more than two values of the filter input voltage. Such measurements however lengthen the presetting of the VCO frequency and as a result the locking time of circuit 80. A trade off between the number of measurements and the accuracy of the approximation of the characteristic of VCO 40 needs to be made on a case-by-case basis.

It is to be noted that, with respect to the described method and circuit, modifications or improvements may be proposed without departing from the scope of the invention. For instance, it is clear that this method or circuit may be implemented in several manners, such as by means of wired electronic circuits or, alternatively, by means of a set of instructions stored in a computer-readable medium, said instructions replacing at least a part of said circuits and being executable under the control of a computer or a digital processor in order to carry out the same functions as fulfilled in said replaced circuits. The invention is thus not limited to the examples provided herein.

I claim:

1. A circuit comprising:
  a frequency synthesizing circuit comprising a voltage controlled circuit (40) for generating an oscillating signal from an input voltage, and the frequency synthesizing circuit being configured to operate in a phase locked loop mode under control of an error signal representative of a phase differential between the oscillating signal and a reference signal;
  a digital processing unit (60) configured determine a first and a second frequency of the oscillating signal obtained in response to respective first and second input voltage values and, further configured to generate a control value from the two frequencies and the reference signal;
  a digital to analog converter (70) configured to preset the input voltage to a preset value in response to the control value; and
  a loop filter whose output is connected to an input of the voltage controlled circuit, and wherein the output of the digital to analog converter is directly connected to an input of the loop filter and the digital to analog converter sets the input of the loop filter to the preset value.

2. The circuit of claim 1, wherein the digital to analog converter is disabled when the frequency synthesizing circuit operates in the locked loop mode.

3. The circuit of claim 1, further comprising:
  a phase frequency detector configured to generate the error signal;
  a charge pump circuit and a loop filter
  wherein the charge pump circuit provides a current in response to the error signal and the loop filter determines the oscillating signal.

4. The circuit of claim 1, wherein the digital processing unit further determines a characteristic of the voltage controlled oscillator from the first and second frequencies and the first and second voltage values and further determines the control value from the determined characteristic and the reference signal.

5. The circuit of claim 1, wherein the digital processing unit further determines the preset value from a linear interpolation of a characteristic of the voltage controlled oscillator based on the first and second frequencies, the first and second voltage values and the frequency of the reference signal, and the digital processing unit further determines the control value from a look up table comprising control values associated with respective values of the input voltage.

6. A device comprising:
  a frequency synthesizing circuit comprising a voltage controlled circuit (40) for generating an oscillating signal from an input voltage, and the frequency synthesizing circuit being configured to operate in a phase locked loop mode under control of an error signal representative of a phase differential between the oscillating signal and a reference signal;

a digital processing unit (60) configured to determine a first and a second frequency of the oscillating signal obtained in response to respective first and second input voltage values and, further configured to generate a digital control value from the two frequencies and the reference signal, wherein the digital control value is calculated based on a linear interpolation of the first and second frequency; and, a digital to analog converter (70) directly connected to a loop filter and being configured to preset the input voltage in response to the digital control value.

7. The device of claim 6, further comprising:

a transmission module for transmitting a data signal modulated using the oscillating signal.

8. The device of claim 6, further comprising:

a reception module for receiving a data signal and demodulating the data signal using the oscillating signal.

9. A method for presetting an input voltage of a voltage controlled oscillator of a frequency synthesizing circuit adapted to operate in a locked loop mode, the method comprising:

while the frequency synthesizing circuit is disabled, determining a first and a second oscillating frequencies of the voltage controlled oscillator (40) in response to a first and a second input voltages;

interpolating the pre-set input voltage from a reference frequency, the first and second frequencies and the first and second input voltage values; and enabling to set the input voltage to the preset value by means of a digital to analog converter (70) which is directly connected to a loop filter.

10. The method of claim 9, further comprising:

when the input voltage is set to the preset value, enabling the frequency synthesizing circuit to operate in the locked loop mode.

11. The method of claim 9, wherein the pre-set input voltage is further interpolated from a frequency divider division ratio.

\* \* \* \* \*